(12) United States Patent
Carcouet et al.

(10) Patent No.: US 10,790,249 B2
(45) Date of Patent: Sep. 29, 2020

(54) DISCRETE ELECTRONIC COMPONENT COMPRISING A TRANSISTOR

(71) Applicant: Commissariat à l'Energie Atomique et aux Energies Alternatives, Paris (FR)

(72) Inventors: Sébastien Carcouet, Grenoble (FR); Xavier Maynard, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/449,408

(22) Filed: Jun. 23, 2019

(65) Prior Publication Data

US 2019/0393175 A1  Dec. 26, 2019

(30) Foreign Application Priority Data

Jun. 25, 2018 (FR) ...................... 1855671

(51) Int. Cl.
*H01L 23/00* (2006.01)
*H01L 23/498* (2006.01)
(Continued)

(52) U.S. Cl.
CPC .......... *H01L 24/08* (2013.01); *H01L 23/3121* (2013.01); *H01L 23/49* (2013.01);
(Continued)

(58) Field of Classification Search
CPC ..... H01L 24/08; H01L 24/48; H01L 23/3121; H01L 23/49; H01L 23/49811; H01L 23/49866; H01L 2224/04042; H01L 2224/08225; H01L 2224/48175; H01L 2924/10253; H01L 2924/10272; H01L 2924/1033; H01L 2924/13064; H01L 2924/13091
(Continued)

(56) References Cited

U.S. PATENT DOCUMENTS

2007/0259514 A1* 11/2007 Otremba ................. H01L 24/13
                                                     438/612
2008/0308929 A1   12/2008 Chen et al.
(Continued)

OTHER PUBLICATIONS

Preliminary Search Report for French Application No. 1855671 dated Nov. 28, 2018, 2 pages.

*Primary Examiner* — Tong-Ho Kim
(74) *Attorney, Agent, or Firm* — Moreno IP Law LLC

(57) ABSTRACT

The invention concerns a discrete electronic component including: a semiconductor chip including a transistor, the chip including a first metallization of connection to a first conduction region of the transistor; and a printed circuit board including first and second separate connection pads, wherein: the chip is assembled on the printed circuit board so that the first metallization of the chip is in contact with the first and second connection pads of the printed circuit board; and the assembly including the semiconductor chip and the printed circuit board is encapsulated in a package made of an insulating material leaving access to first and second connection terminals of the component connected, inside of the package, respectively to the first and second connection pads of the printed circuit board.

9 Claims, 3 Drawing Sheets

(51) Int. Cl.
  *H01L 23/31* (2006.01)
  *H01L 23/49* (2006.01)

(52) U.S. Cl.
  CPC .. *H01L 23/49811* (2013.01); *H01L 23/49866* (2013.01); *H01L 24/48* (2013.01); *H01L 2224/04042* (2013.01); *H01L 2224/08225* (2013.01); *H01L 2224/48175* (2013.01); *H01L 2924/1033* (2013.01); *H01L 2924/10253* (2013.01); *H01L 2924/10272* (2013.01); *H01L 2924/13064* (2013.01); *H01L 2924/13091* (2013.01)

(58) Field of Classification Search
  USPC .......................................................... 257/77
  See application file for complete search history.

(56) References Cited

U.S. PATENT DOCUMENTS

| | | |
|---|---|---|
| 2013/0020694 A1 | 1/2013 | Liang et al. |
| 2014/0061897 A1 | 3/2014 | Lin et al. |
| 2014/0210061 A1 | 7/2014 | Otremba et al. |
| 2015/0008575 A1 | 1/2015 | Liu et al. |

\* cited by examiner

DISCRETE ELECTRONIC COMPONENT COMPRISING A TRANSISTOR

FIELD

The present disclosure concerns the field of discrete electronic components, and more particularly aims at a discrete electronic component comprising a transistor.

BACKGROUND

Many electronic devices comprising one or a plurality of discrete electronic components assembled on a printed circuit board have already been provided. Power converters where one or a plurality of discrete transistors assembled on a printed circuit board are controlled in switched mode at a relatively high frequency, called switching frequency, for example, a frequency greater than 10 kHz, have in particular been provided. In such a converter, it is desirable for the transistor switching speed (turn-off and turn-on speed) to be as high as possible. This indeed enables to increase the switching frequency of transistors, and accordingly to decrease the dimensions of one or a plurality of passive components (inductance(s) and/or capacitor(s)) of the converter, while maintaining the converter losses at a relatively low level. In practice, the transistor switching speed is however limited, particularly due to the parasitic inductances of the conductive connection elements coupling each transistor to a transistor control circuit.

SUMMARY

Thus, an embodiment provides a discrete electronic component comprising:
a semiconductor chip comprising a transistor, the chip comprising a first metallization of connection to a first conduction region of the transistor; and
a printed circuit board comprising first and second separate connection pads,
wherein:
the chip is assembled on the printed circuit board so that the first metallization of the chip is in contact with the first and second connection pads of the printed circuit board; and
the assembly comprising the semiconductor chip and the printed circuit board is encapsulated in a package made of an insulating material leaving access to first and second connection terminals of the component, connected, inside of the package, respectively to the first and second connection pads of the printed circuit board.

According to an embodiment:
the chip further comprises a second metallization of connection to a second conduction region of the transistor, and a third metallization of connection to a control region of the transistor;
the printed circuit board further comprises third and fourth connection pads;
the chip is assembled on the printed circuit board so that the second and third metallizations of the chip are respectively in contact with the third and fourth connection pads of the printed circuit board; and
the package of the component leaves access to third and fourth connection terminals of the component, connected, inside of the package, respectively to the third and fourth connection pads of the printed circuit board.

According to an embodiment, in top view, the distance between the second pad of the printed circuit board and the fourth pad of the printed circuit board is shorter than one tenth of the largest dimension of the chip.

According to an embodiment, the connection pads of the printed circuit board are made of metal.

According to an embodiment, the connection pads of the printed circuit board are made of copper.

According to an embodiment, the transistor is a MOS transistor, the first conduction region being a source region of the transistor.

According to an embodiment, the second conduction region is a drain region of the transistor and the control region is a gate region of the transistor.

According to an embodiment, the transistor is a gallium nitride transistor, a silicon carbide MOS transistor, or a silicon superjunction MOS transistor.

According to an embodiment, the connection terminals of the component are metal pins.

According to an embodiment, the connection terminals of the component are metal pads.

The foregoing and other features and advantages will be discussed in detail in the following non-limiting description of specific embodiments in connection with the accompanying drawings.

DETAILED DESCRIPTION OF THE PRESENT EMBODIMENTS

Figure 1A:
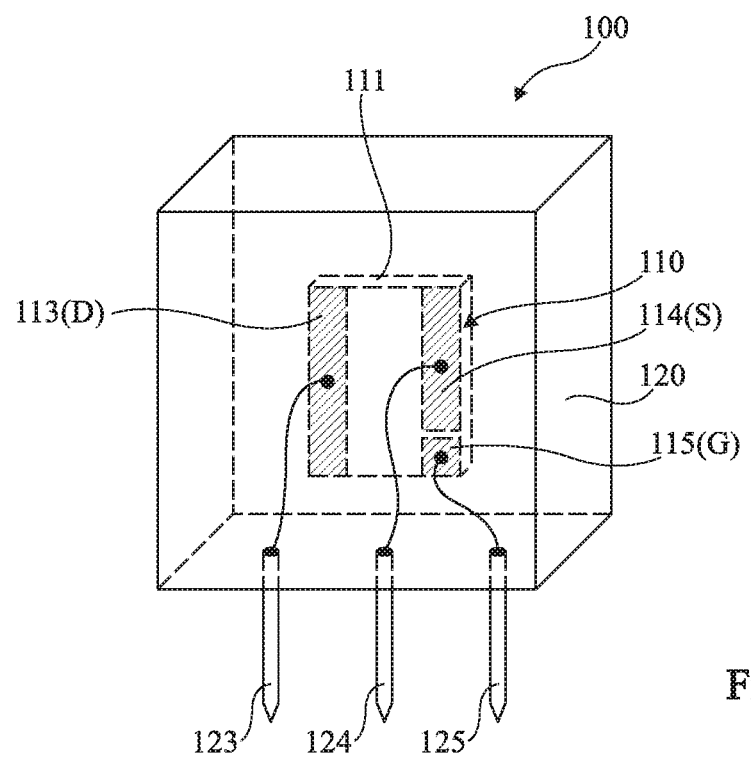
FIG. 1A is a simplified perspective view of an example of a discrete electronic component comprising a transistor.

The same elements have been designated with the same reference numerals in the various drawings and, further, the various drawings are not to scale. For clarity, only those steps and elements which are useful to the understanding of the described embodiments have been shown and are detailed. In particular, the structure of the semiconductor chips having the transistors of the described discrete electronic components formed inside and on top of them has not been detailed, the described embodiments being compatible with all or most known transistor chip structures. Further, the complete electric diagrams of the electronic devices where the described discrete electronic components may be used have not been detailed, the described embodiments being compatible with all or most electronic devices comprising discrete electronic components made up of transistors, and in particular discrete transistors controlled in switched mode, for example, switched-mode converters.

It should be noted that the term discrete electronic component comprising a transistor here designates a component comprising at least one semiconductor chip comprising a transistor, and a package of encapsulation of the semiconductor chip, for example, made of an insulating material, leaving access to at least three conductive pads of connection to an external device, respectively connected to the two conduction terminals of the transistor (the source and the drain in the case of a MOS transistor or in the case of a HEMT (High Electron Mobility Transistor), for example, a gallium nitride (GaN) HEMT), and to a control terminal of the transistor (the gate in the case of a MOS transistor or in the case of a GaN HEMT). Although the described embodiments are not limited to this specific case, power transistors, that is, transistors capable of holding relatively high voltages in the off (non-conductive) state, for example, voltages greater than or equal to 100 V and preferably greater than or equal to 500 V, and/or capable of conducting relatively high currents in the on state (conductive), for example, currents greater than or equal to 1 A, and preferably greater than or equal to 10 A, are here more particularly considered.

Further, the term printed circuit board or PCB here means a plate-shaped support capable of holding and of electrically coupling to connection pads at least one electronic component and, possibly, of holding and of electrically coupling together a plurality of discrete electronic components, to form a complex electronic device also called electronic board. A printed circuit board is for example formed of a stack of a support layer made of an insulating material, and of one or a plurality of conductive layers, for example, made of copper, separated from one another by an insulating material. The conductive layers are locally etched, for example, by a chemical process, to define conductive connection pads and, possibly, an assembly of conductive tracks coupling to one another the connection pads of the printed circuit board.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings, it being understood that, in practice, the described devices may be oriented differently. The terms "approximately", "substantially", and "in the order of" are used herein to designate a tolerance of plus or minus 10%, preferably of plus or minus 5%, of the value in question.

FIG. 1A is a simplified perspective view of a discrete electronic component 100 comprising a transistor. Component 100 comprises a semiconductor chip 110 having the active portion of the transistor formed inside and on top of it. Semiconductor chip 110 particularly comprises a semiconductor substrate 111, for example, made of silicon, of silicon carbide, of gallium nitride, or of any other semiconductor material adapted to the forming of a transistor. Chip 110 further comprises, on at least one surface of substrate 111, at least three metallizations 113, 114, and 115, respectively in contact with first and second conduction regions of the transistor and with a control region of the transistor. As an example, the transistor is a GaN HEMT or a MOS transistor, and metallizations 113, 114, and 115 are respectively in contact with the drain (D), the source (S), and the gate (G) of the transistor. In this example, semiconductor chip 110 is encapsulated in a package 120 made of an insulating material, for example, of resin, leaving access to only three conductive elements or terminals of connection to an external device 123, 124, and 125, for example, made of metal. In the shown example, connection terminals 123, 124, and 125 are pin-shaped. Inside of package 120, connection terminals 123, 124 and 125 are electrically connected respectively to metallizations 113, 114, and 115 of chip 110. The electric connection between terminals 123, 124, and 125 and metallizations 113, 114, and 115 may be ensured by all adapted connection conductors, for example, by conductive wires or conductive blades.

In practice, component 100 is intended to be assembled on a printed circuit board (not shown), so that connection terminals 123, 124, and 125 are mechanically fastened to the printed circuit board and electrically connected to corresponding connection conductive pads of the printed circuit board, for example, by welding or by soldering. The printed circuit board may further comprise conductive tracks coupling connection pads 123, 124, and 125 to pads of connection to other discrete components of an electronic device and/or to external connection terminals of the electronic device.

Figure 1B:
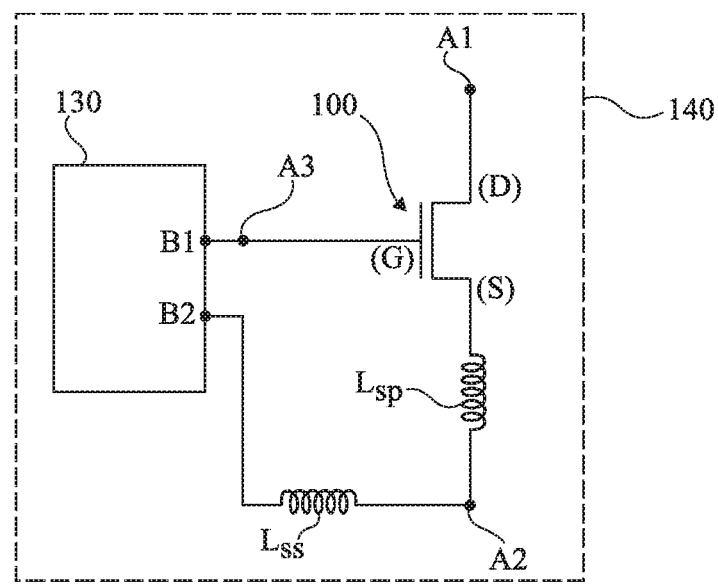
FIG. 1B is an equivalent electric diagram of an electronic device comprising the component of FIG. 1A and a circuit of control of the component.

FIG. 1B is an equivalent electric diagram of an electronic device comprising component 100 of FIG. 1A and a circuit 130 of control of this component, assembled on a printed circuit board 140. For simplification, FIG. 1B only schematically shows a terminal A1 of printed circuit board 140, having terminal 123 of component 100 (corresponding to the transistor drain) connected thereto, a terminal A2 of printed circuit board 140, having terminal 124 of component 100 (corresponding to the transistor source) connected thereto, and a terminal A3 of printed circuit board 140, having terminal 125 of component 100 (corresponding to the transistor gate) connected thereto. In use, component 100 has the function of modulating or of switching a current flowing between terminals A1 and A2 of the device. To achieve this, control circuit 130 applies an electric control signal between terminals A3 and A2 of the device. More particularly, in the case of a GaN HEMT or of a MOS transistor, the control circuit applies a control voltage between the gate (via terminal A3 and terminal 125) and the source (via terminal A2 and terminal 124) of the transistor to control the current flowing between the drain and the source of the transistor. Control circuit 130 comprises a first terminal B1 connected to terminal A3, and a second terminal B2 connected to terminal 124.

FIG. 1B shows a first inductance $L_{sp}$, coupling the source (S) of the transistor of component 100 to terminal A2, and a second inductance $L_{ss}$ coupling terminal A2 to terminal B2 of control circuit 130. Inductance $L_{sp}$ corresponds to the parasitic inductance of all the conductors coupling the source (S) of the transistor to terminal A2, mainly corresponding to the parasitic inductance of connection terminal 125, and, possibly, of the conductive track(s) coupling terminal 125 to terminal A2. Inductance $L_{ss}$ corresponds to the parasitic inductance of all the conductors coupling terminal A2 of the device to terminal B2 of control circuit 130.

Although parasitic inductances $L_{sp}$ and $L_{ss}$ are very low, they may disturb the gate-source voltage effectively seen by the transistor. In particular, in operation, inductance $L_{sp}$ is capable of conducting significant currents since is it located on the main power path of the transistor. In a switching to the off state or to the on state of the transistor, a fast variation of the current flowing through inductance $L_{sp}$ occurs, which may generate a relatively high voltage across inductance $L_{sp}$. As an example, for a switching of a 50-A current in a 5-ns switching period, the current variation speed in inductance $L_{sp}$ is 50 kA/μs. Considering an inductance $L_{sp}$ of 1 nH (which corresponds to a conductive track length in the order of 1 mm on a printed circuit board), the voltage across inductance $L_{sp}$ during the switching period may reach 10 V. Thus, the control terminal effectively seen by the transistor is strongly influenced by parasitic inductance $L_{sp}$, which may cause malfunctions, or even a breakdown of the transistor.

Inductance $L_{ss}$ is less disturbing since the currents that it conducts are in practice negligible with respect to the current flowing through inductance $L_{sp}$.

A solution to limit the above-discussed malfunctions is to limit the transistor switching speed. As indicated hereabove, in a switched-mode converter, this implies a decrease in the switching frequency and accordingly an increase in the dimensions of the passive components of the converter, as well as an increase in switching losses.

Figure 2A:
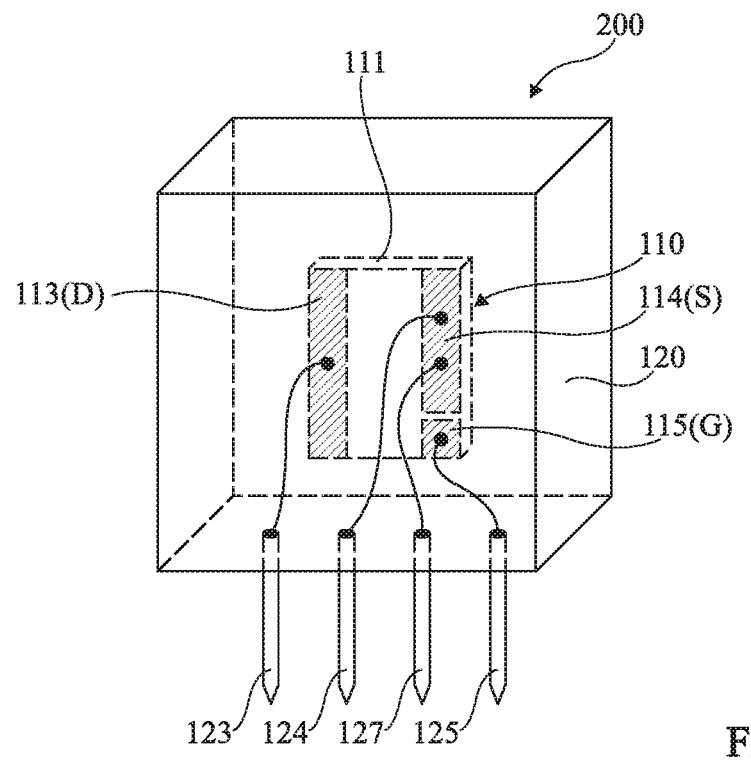
FIG. 2A is a simplified perspective view of another example of a discrete electronic component comprising a transistor.

FIG. 2A is a simplified perspective view of another example of a discrete electronic component 200 comprising a transistor. Component 200 of FIG. 2A comprises the same elements as component 100 of FIG. 1A, arranged substantially in the same way, and further comprises an additional terminal 127 of connection to an external device. In the shown example, terminal 127 is a connection pin similar to connection pins 123, 124 and 125, for example, arranged on the same surface of package 120 as pins 123, 124 and 125. Terminal 127 is for example made of the same conductive material as terminals 123, 124 and 125. Inside of package 120, additional terminal 127 is connected to the source region of the transistor. More particularly, in the shown example, inside of package 120, additional terminal 127 is connected to the same source metallization 114 as terminal 124. As seen from the outside, additional terminal 127 is however laterally insulated from terminal 124 by the insulating material of package 120. In other words, inside of the package, there exists no common portion between the connection path from terminal 124 to metallization 114 and the connection path from terminal 127 to metallization 114.

In practice, component 200 is intended to be assembled on a printed circuit board (not shown), so that connection terminals 123, 124, 125, and 127 are mechanically fastened to the printed circuit board and electrically connected to corresponding connection conductive pads of the printed circuit board, for example, by welding or by soldering. The printed circuit board may further comprise conductive tracks coupling connection pads 123, 124, 125, and 127 to pads of connection to other discrete components of an electronic device and/or to external connection terminals of the electronic device.

Terminal 127 forms a source control terminal, intended to be connected to a transistor control circuit, while terminal 124 forms a conduction source terminal, intended to be connected on the power path of the transistor.

Figure 2B:
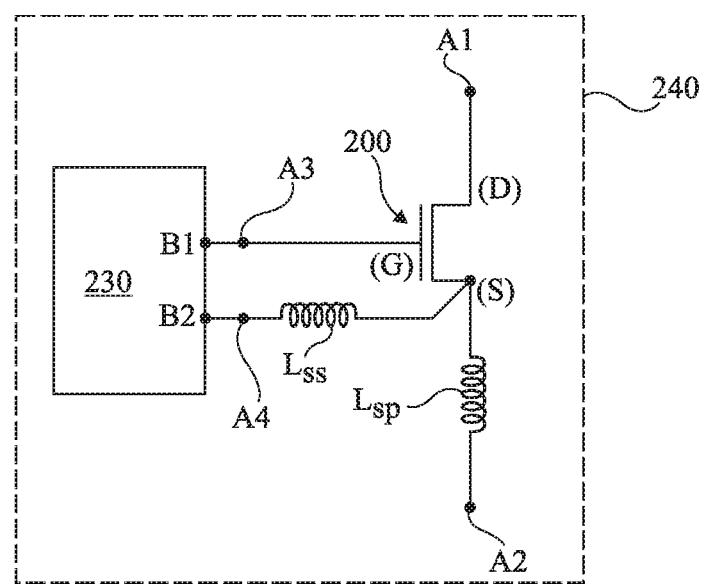
FIG. 2B is an equivalent electric diagram of an electronic device comprising the component of FIG. 2A and a circuit of control of the component.

FIG. 2B is an equivalent electric diagram of an electronic device comprising component 200 of FIG. 2A and a circuit 230 of control of the component, assembled on a printed circuit board 240. For simplification, FIG. 2B simply schematically shows a terminal A1 of printed circuit board 240 having terminal 123 of component 200 connected thereto, a terminal A2 of printed circuit board 240 having terminal 124 of component 200 connected thereto, a terminal A3 of printed circuit board 240 having terminal 125 of component 200 connected thereto, and a terminal A4 of printed circuit board 240 having terminal 127 of component 200 connected thereto. In this example, terminals A2 and A4 of the printed circuit board are separate, that is, in the absence of component 200 (before assembly of component 200 on the printed circuit board), terminals A2 and A4 are electrically insulated from each other.

In use, component 200 has the function of modulating or of switching a current flowing between terminals A1 and A2 of the device. To achieve this, the device comprises a control circuit 230 connected to terminals A3 and A4 of the printed circuit board. In operation, control circuit 230 applies an electric control signal between terminals A3 and A4 of the device. More particularly, in the case of a GaN HEMT or of a MOS transistor, the control circuit applies a control voltage between the gate (via terminal A3 and terminal 125) and the source (via terminal A4 and terminal 127) of the transistor to control the current flowing between the drain (via terminals A1 and 123) and the source (via terminals 124 and A2) of the transistor. Control circuit 230 comprises a first terminal B1 connected to terminal A3 and a second terminal B2 connected to terminal A4.

FIG. 2B shows a first inductance $L_{sp}$, coupling the source (S) of transistor of component 200 to terminal A2, and a second inductance $L_{ss}$ coupling the source (S) of the transistor to terminal B2 of control circuit 230. Inductance $L_{sp}$ corresponds to the parasitic inductance of all the conductors coupling the source (S) of the transistor to terminal A2, mainly corresponding to the parasitic inductance of connection terminal 124, and, possibly, of the conductive track(s) coupling terminal 124 to terminal A2. Inductance $L_{ss}$ corresponds to the parasitic inductance of all the conductors coupling the source (S) of the transistor to terminal B2, mainly corresponding to the parasitic inductance of connection terminal 127 and, possibly, of the conductive track(s) coupling terminal 127 to terminal B2 (in the shown example, the parasitic inductance of the conductive track(s) coupling terminal A4 to terminal B2 is considered as negligible).

As illustrated in the diagram of FIG. 2B, the provision, in component 200, of a terminal of control of source 127 different from conduction source terminal 124 and, on printed circuit board 240, of a corresponding source control terminal A4 different from conduction source terminal A2, enables to make the source connection parasitic inductance seen both by control circuit 230 and by the power path of the device negligible.

In the configuration of FIGS. 2A and 2B, inductance $L_{sp}$ is still likely to conduct significant currents, which may, as explained hereabove in relation with FIG. 1B, result in the appearing of a relatively high voltage thereacross when the transistor switches. However, unlike the configuration of FIGS. 1A and 1B, this does not disturb the control voltage effectively seen by the transistor, since inductance $L_{sp}$ is outside of the connection path between terminal B2 of the control circuit and the transistor source.

As in the configuration of FIGS. 1A and 1B, inductance $L_{ss}$ is little disturbing since the currents that it conducts are negligible with respect to the current crossing inductance $L_{sp}$.

Thus, the configuration of FIGS. 2A and 2B enables to apply to the transistor a higher switching speed than in the configuration of FIGS. 1A and 1B, without increasing risks of malfunctions.

However, a difficulty is that the manufacturing of a component of the type described in relation with FIG. 2A is relatively complex. In particular, the electric connections, inside of package 120, between the metallizations of semiconductor chip 110 and connection terminals 123, 124, 125, and 127 are difficult to form, particularly due to the limited volume inside of the package and, especially, to the double connection which should be achieved on the source metallization 114 of the transistor.

According to an aspect of an embodiment, it is provided to arrange, inside of the package of a discrete electronic component comprising a transistor, a printed circuit board comprising two separate connection pads, the semiconductor chip of the component being directly assembled on the printed circuit board internal to the package so that the source metallization of the chip is in contact with the two connection pads of the printed circuit board. The component further comprises two connection terminals accessible outside of the package, connected, inside of the package, respectively to the two pads of the printed circuit board.

Figure 3A:
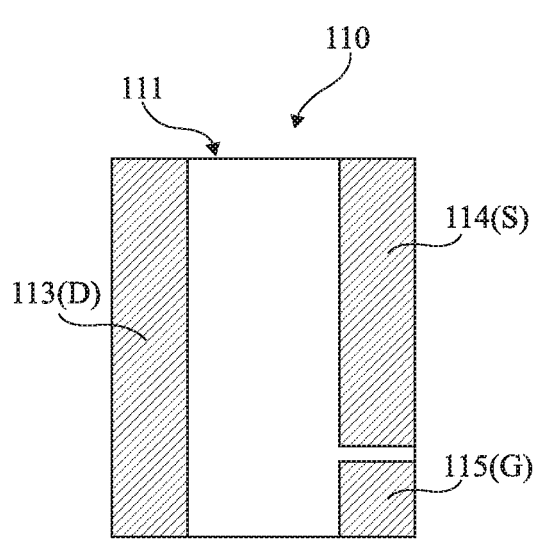
FIG. 3A is a simplified bottom view of an example of a semiconductor chip comprising a transistor.

FIG. 3A is a simplified bottom view of an example of a semiconductor chip 110 of a discrete electronic component according to an embodiment. Chip 110 is for example identical or similar to chip 110 described in relation with FIG. 1A. Chip 110 comprises, in particular, a semiconductor substrate 111, having a transistor formed inside and on top of it. Chip 110 further comprises, arranged on one or a plurality of surfaces of substrate 111, at least three metallizations 113, 114, and 115 respectively in contact with first and second conduction regions of the transistor and with a control region of the transistor. As an example, the transistor is a GaN HEMT or a MOS transistor, and metallizations 113, 114, and 115 are respectively in contact with the drain (D), the source (S), and the gate (G) of the transistor. In this example, the three metallizations 113, 114, and 115 are arranged on a same surface of substrate 111 (the surface apparent in FIG. 3A, that is, the lower surface of the substrate).

Figure 3B:
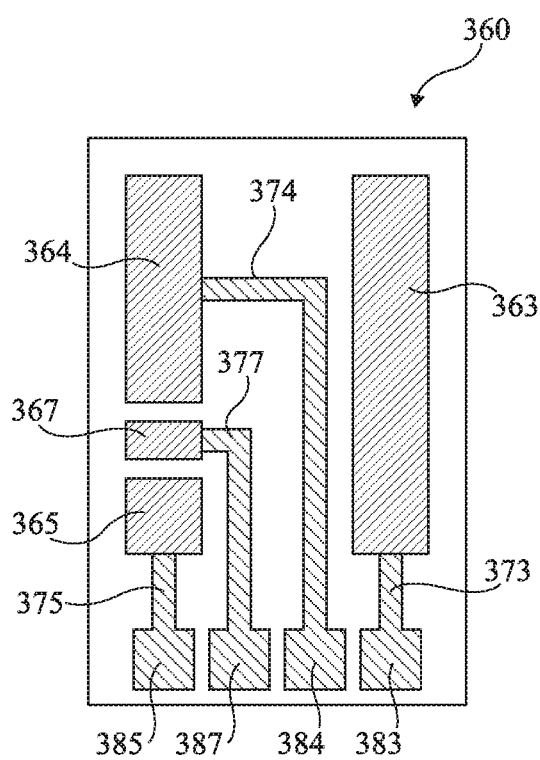
FIG. 3B is a simplified top view of an example of a printed circuit board intended to receive the chip of FIG. 3A.

FIG. 3B is a simplified top view of an example of a printed circuit board 360 intended to receive chip 110 of FIG. 3A. Printed circuit board 360 comprises, on its upper surface side, four connection pads 363, 364, 365, and 367, for example, made of metal, for example, of copper. Pads 363 and 365 are intended to be respectively connected to connection metallizations 113 and 115 of chip 110. Pads 364 and 367 are both intended to be connected to metallization 114 of chip 110. In this example, pads 367 and 364 are separate, that is, in the absence of chip 110 (before assembly of chip 110 on printed circuit board 360), pads 364 and 367 are electrically insulated from each other. Pad 364 forms a conduction source pad of the component, and pad 367 forms a source control pad of the component.

In this example, chip 110 and printed circuit board 360 are intended to be assembled by surface mounting. In other words, the lower surface of each of metallizations 113 and 115 of chip 110 is fastened and electrically connected, for example, by welding or soldering, to the upper surface of the corresponding connection pad 363, respectively 365. Further, the lower surface of metallization 114 of chip 110 is fastened and electrically connected, for example, by welding or by soldering, both to the upper surface of pad 364 and to the upper surface of pad 367.

Preferably, the source control 367 of printed circuit board 360 is close to the gate connection pad 365 of the printed circuit board, that is, it is laterally separated from pad 365 only by the insulating material of the printed circuit board, rather than by another conductive element of the printed circuit board. As an example, in top view, the distance between pad 365 and pad 367 is shorter than one tenth of the largest dimension of semiconductor chip 110.

Printed circuit chip 360 may further comprise conductive tracks 373, 374, 375, 377 coupling connection pads 363, 364, 365, 367 respectively to pads 383, 384, 385, 387 of connection to the outside of printed circuit board 360. In this example, pads 383, 384, 385, and 387 of printed circuit board 360 are intended to be connected to external connection terminals of the discrete electronic component.

Figure 3C:
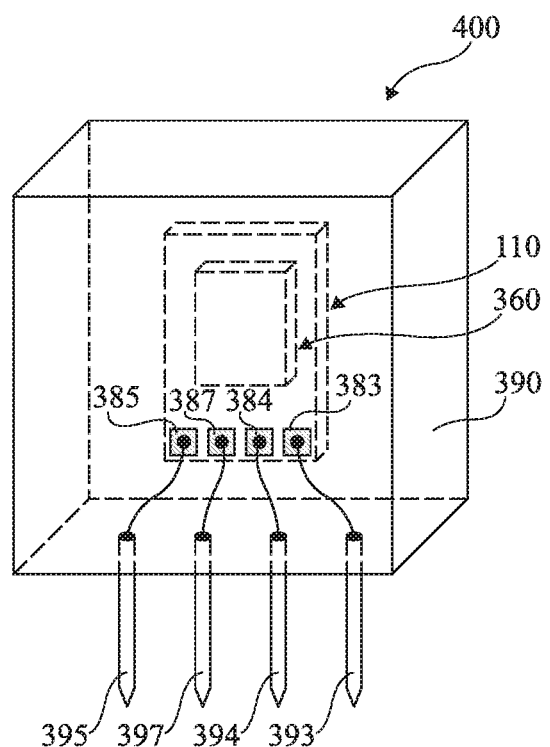
FIG. 3C is a simplified perspective view of an embodiment of a discrete electronic component comprising the chip of FIG. 3A assembled on the printed circuit board of FIG. 3B.

FIG. 3C is a simplified perspective view of an embodiment of a discrete electronic component 400 comprising the chip 110 of FIG. 3A assembled on printed circuit board 360 of FIG. 3B.

Component 400 comprises a package 390 made of an insulating material, for example, of resin, having the assembly comprising printed circuit board 360 and semiconductor chip 110 encapsulated therein, assembled on the surface of printed circuit board 360. In this example, package 390 leaves access to four conductors or terminals of connection to an external device 393, 394, 395, and 397. In the example of FIG. 3C, connection terminals 393, 394, 395, and 397 are pin-shaped. Inside of package 390, connection terminals 393, 394, 395, and 397 are respectively electrically connected to connection pads 383, 384, 385, and 387 of printed circuit board 360. The electric connection between terminals 393, 394, 395, and 397 and the corresponding connection pads 383, 384, 385, and 387 of printed circuit board 360 may be ensured by all adapted connection conductors, for example, conductive wires or conductive blades.

In practice, component 400 is intended to be assembled on a printed circuit board (not shown), so that the connection terminals 393, 394, 395, and 397 of the component are mechanically fastened to the printed circuit board and electrically connected to corresponding connection conductive pads of the printed circuit board, for example, by welding or by soldering. The printed circuit board may further comprise conductive tracks coupling connection terminals 393, 394, 395, and 397 to pads of connection to other discrete components of an electronic device and/or to external connection terminals of the electronic device. In particular, connection terminals 395 and 397 may be coupled to a circuit of control of component 400, assembled on the same printed circuit board as component 400, to obtain an operation similar to what has been described in relation with FIGS. 2A and 2B.

An advantage of the embodiment of a discrete electronic component described in relation with FIGS. 3A, 3B, and 3C is that the provision of a printed circuit board internal to the component package eases the forming of the electric connections between the semiconductor chip of the component and the external connection terminals of the component and, more particularly, the forming of two separate electric connections from the source metallization of the transistor to two different external connection terminals of the component.

Figure 4:
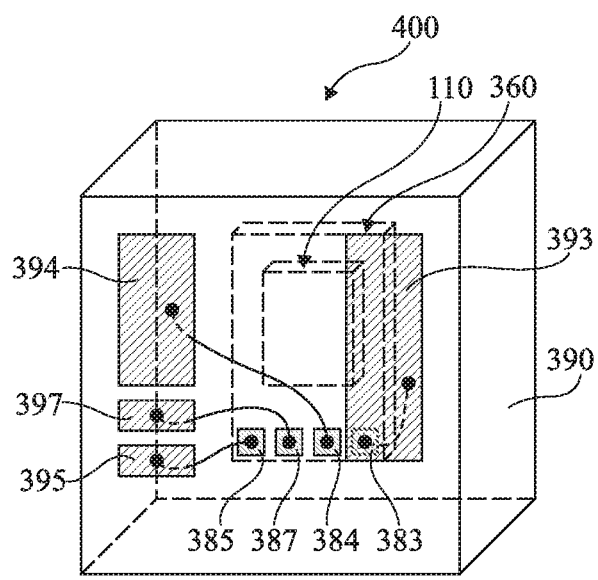
FIG. 4 is a simplified perspective view of another embodiment of a discrete electronic component comprising the chip of FIG. 3A assembled on the printed circuit board of FIG. 3B.

FIG. 4 is a simplified perspective view of an alternative embodiment of the discrete electronic component 400 of FIG. 3C.

Component 400 of FIG. 4 differs from component 400 of FIG. 3C mainly in that, in the example of FIG. 4, the conductors of connection to the outside 393, 394, 395, and 397 instead of being conductive pins, as in the example of FIG. 3C, are conductive pads. In the shown example, package 390 of component 400 has a substantially parallelepipedal general shape, conductive pads 393, 394, 395, and 397 being arranged on a same surface of the package, to allow a surface mounting of the component on a printed circuit board.

Specific embodiments have been described. Various alterations and modifications will occur to those skilled in the art. In particular, embodiments applied to GaN HEMTs or to MOS transistors have been described hereabove. The embodiments are however not limited to these specific cases. More generally, the described embodiments may be applied to any transistor comprising two conduction terminals and one control terminal intended to receive an electric control signal referenced with respect to one of the conduction terminals, for example, bipolar transistors or field-effect transistors. The described embodiments are particularly adapted to fast-switching transistors. In addition to the above-mentioned examples, the described embodiments are particularly advantageous for silicon carbide MOS transistors or for silicon superjunction MO S transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A discrete electronic component comprising:
a semiconductor chip comprising a transistor, the chip comprising a first metallization of connection to a first conduction region of the transistor, a second metallization of connection to a second conduction region of the transistor, and a third metallization of connection to a control region of the transistor; and
a printed circuit board comprising first, second, third, and fourth separate connection pads,
wherein:
the chip is assembled on the printed circuit board so that the first metallization of the chip is in contact with the first and second connection pads of the printed circuit board, and so that the second and third metallizations of the chip are respectively in contact with the third, and fourth connection pads of the printed circuit board; and
an assembly comprising the semiconductor chip and the printed circuit board is encapsulated in a package made of an insulating material leaving access to first, second, third, and fourth connection terminals of the component, connected, inside of the package, respectively to the first, second, third, and fourth connection pads of the printed circuit board.

2. The component of claim 1, wherein in top view, a distance between the second pad of the printed circuit board and the fourth pad of the printed circuit board is shorter than one tenth of a largest dimension of the chip.

3. The component of claim 1, wherein the connection pads of the printed circuit board are made of metal.

4. The component of claim 3, wherein the connection pads of the printed circuit board are made of copper.

5. The component of claim 1, wherein the transistor is a MOS transistor, the first conduction region being a source region of the transistor.

6. The component of claim 5, wherein the second conduction region is a drain region of the transistor and the control region is a gate region of the transistor.

7. The component of claim 1, wherein the transistor is a gallium nitride transistor, a silicon carbide MOS transistor, or a silicon superjunction MOS transistor.

8. The component of claim 1, wherein the connection terminals of the component are metal pins.

9. The component of claim 1, wherein the connection terminals of the component are metal pads.

* * * * *